United States Patent [19]

Takagi et al.

[11] 4,351,099
[45] Sep. 28, 1982

[54] METHOD OF MAKING FET UTILIZING SHADOW MASKING AND DIFFUSION FROM A DOPED OXIDE

[75] Inventors: Hiromitsu Takagi, Shiga; Shotaro Umebachi, Kyoto; Gota Kano, Nagaokakyo; Iwao Teramoto, Ibaraki, all of Japan

[73] Assignee: Matsushita Electronics Corporation, Kadoma, Japan

[21] Appl. No.: 149,621

[22] Filed: May 12, 1980

[30] Foreign Application Priority Data

May 18, 1979 [JP] Japan .................................. 54-61857

[51] Int. Cl.$^3$ .................. H01L 21/31; H01L 21/265; H01L 21/225
[52] U.S. Cl. ........................................ 29/571; 29/578; 29/579; 148/1.5; 148/188; 156/628; 156/644; 156/653; 156/657; 357/22; 357/91
[58] Field of Search .......................... 29/571, 578, 579; 148/1.5, 188; 156/628, 644, 653, 657; 357/22, 91

[56] References Cited

U.S. PATENT DOCUMENTS

| | | | |
|---|---|---|---|
| 3,519,852 | 7/1970 | Jennings et al. | 357/22 X |
| 3,676,230 | 7/1972 | Rice | 148/188 X |
| 3,753,807 | 8/1973 | Hoare et al. | 148/188 |
| 3,886,582 | 5/1975 | Kobayashi et al. | 357/22 |
| 3,940,288 | 2/1976 | Takagi et al. | 148/1.5 |
| 3,980,508 | 9/1976 | Takamiya et al. | 148/188 |
| 4,075,652 | 2/1978 | Umebachi et al. | 357/22 X |
| 4,084,987 | 4/1978 | Godber | 148/188 X |
| 4,149,904 | 4/1979 | Jones | 148/1.5 |

Primary Examiner—L. Dewayne Rutledge
Assistant Examiner—W. G. Saba
Attorney, Agent, or Firm—Cushman, Darby & Cushman

[57] ABSTRACT

A novel self-align type method of making an FET with a very short gate length and a good high frequency characteristic, and a low noise characteristic, the method comprising the steps of:

forming on a silicon epitaxial layer (13) of n-type conductivity a doped oxide film (14) containing boron as an impurity to give p-type conductivity, forming a mask (15a, 16a) containing Si$_3$N$_4$ film and having a width larger than that of a gate region (19) to be formed on said n-type epitaxial layer (13), etching said doped oxide film (14) by utilizing said mask (15a, 16a) as an etching mask to expose surface of said silicon crystal layer (13) in a manner that sides of the part of said doped oxide film (14) covered by said mask (15, 16a) are side-etched by a predetermined width, ion-implanting an impurity of said first conductivity type into said n-type epitaxial layer (13) by utilizing said mask as implanting mask, and carrying out a heat treating thereby diffusing said second conductivity type impurity from said doped oxide film (14) retained only under said mask into said n-type epitaxial layer (13) to form said gate region (19) and driving said ion-implanted first conductivity type impurity into said silicon crystal layer (13) to form a source region (17) and a drain region (18).

6 Claims, 10 Drawing Figures

METHOD OF MAKING FET UTILIZING SHADOW MASKING AND DIFFUSION FROM A DOPED OXIDE

BACKGROUND OF THE INVENTION

1. Field of the Invention

The present invention relates to a novel method of making a junction gate field effect transistor (hereinafter referred to as J-FET).

More particularly, the present invention relates to a self-alignment method of making a J-FET intended to obtain a short gate length (Lg) and hence a good high frequency characteristic with a low noise performance.

2. Prior Art

Hitherto, J-FET has been generally constructed as shown in FIG. 1, wherein formings of gate PN junction and forming of source and drain ohmic regions are made in separate steps by using different masks.

When a J-FET is used for a high frequency amplification or for a low noise amplification, in general, such characteristics as a small input capacitance and high mutual conductance ($g_m$) are required. In order to improve such characteristics, as fundamental factors in design of the J-FET, it is important to shorten the gate length Lg and to reduce the series resistance by shortening source-gate distance as much as possible. However, with the structure as shown in FIG. 1, it is necessary to use a first mask for use to make a gate region 1, and a second mask for use to make a drain region 2 and a source region 3, and registration of these two masks determines the limit of shortening the gate length and the source-gate distance, and hence determines the limit of the characteristics. In FIG. 1, numeral 4 designates a p-type silicon substrate which also works as a substrate side gate, numeral 5 designates an n-type silicon epitaxial layer and numeral 6 designates an SiO₂ film. Electrodes are omitted in the drawing. Even though adopting an available most advanced technique of mass-production wherein the gate is worked to 2 μm, the minimum sizes are gate length Lg of 2 μm and the source-drain distance of 8 μm.

As an improvement of a III-V crystal heterostructure FET for obtaining a short gate length, an invention of the U.S. Pat. No. 4,075,652, the United Kingdom Pat. No. 1,507,701, the Canadian Pat. No. 1023480 and German Pat. No. 2517049 has been proposed. But the proposed invention is not very suitable for making a J-FET of a short gate length, since it is difficult to make a selective diffusion on the III-V compound and hence the diffused gate region can not be formed and the gate electrode is on the elevated level. Therefore electrode connection to the gate has a problem of liability of cut-off and furthermore the gate is formed on the same side of the wafer as drain and source, and hence the electrode pattern on the wafer is congested thereby limiting the shortening of the drain-source distance.

SUMMARY OF THE INVENTION

Therefore the present invention is intended to overcome the abovementioned problems by providing an improved method of making a silicon J-FET in a self-alignment type process.

In accordance with the present invention, there is no need of mask registration for forming the source and drain regions and a mask for forming the gate region.

According to the present invention, the gate length Lg and the source-drain distance can be accurately and sufficiently made short, thereby improving the characteristics of the J-FET.

According to the present invention, the number of mask registrations can be made certainly small, and surface of the finished wafer becomes smooth, and hence production yield and productivity can be drastically improved.

DESCRIPTION OF THE PREFERRED EMBODIMENT

The method of making an FET in accordance with the present invention comprises the steps of:

forming on a semiconductor layer of a first conductivity type, a doped film containing an impurity to give a second conductivity type which is opposite to said first conductivity type, forming an etching mask having a width larger than that of a gate region to be formed on said semiconductor layer, etching said doped film by utilizing said mask as an etching mask thereby to expose the surface of said semiconductor layer at parts which are not covered by said mask and to side-etch said doped film at the part covered by said mask, ion-implanting an impurity of said first conductivity type into said semiconductor layer by utilizing said mask as an implanting mask, and carrying out a heat treatment to diffuse said second conductivity type impurity from said doped film retained narrowed by said side-etching under said etching mask into said semiconductor layer thereby to form said gate region and also to drive said ion-implanted first conductivity type impurity into said semiconductor layer thereby to form a source region and a drain region.

The invention is elucidated hereinafter referring to the accompanying drawing FIGS. 2 to 4.

Figure 2:
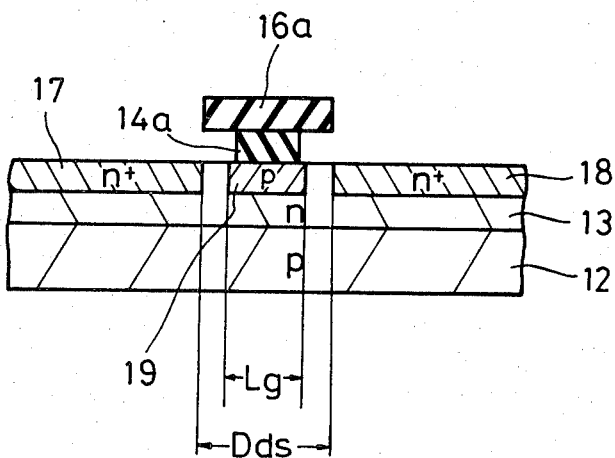
FIG. 2 is a schematic sectional elevation view illustrating the principle of an important step embodying the present invention.

FIG. 2 illustrates the principle of a self-aligning method to produce gate, source and drain regions with only a single mask, without need of conventional mask registrations between a first mask to determine the gate region and a second mask to determine the source and drain regions. The self-aligning process, which is a principal feature of the present invention, is as follows:

On a p-type silicon crystal layer 12 there is formed a substrate of a p⁺-type silicon crystal substrate 11, and an n-type silicon crystal layer 13 is formed by, for example, a known epitaxial growth method. Then, on the n-type silicon crystal layer 13, a doped film 14a, for example, a silicon dioxide film containing a first conductivity type (p) impurity, e.g. boron as an impurity is formed. And, on the doped film 14a, a mask 16a, for example, a silicon nitride film is disposed in a manner that the width of the mask 16a is wider than that of the doped film 14a thereby forming a T-shaped construction by means of, for example, side etching, so that the mask 16a forms eaves parts at both sides thereof. That is, the width of the mask 16a is wider than that of the doped film 14a by the sum of the widths of the eaves on both sides. Then, by ion-implanting a second conductivity type (n) impurity to form a drain region 17 and source region 18 by utilizing the T-shaped construction as a mask, and by carrying out a heat treatment, a gate region 19 is formed by a diffusion of the first impurity from the doped film 14a into the silicon crystal layer 13, and the drain region 17 and the source region 18 are formed by a driving by the heat treatment. Since the pattern of the gate region 19 is defined by the pattern of the doped film 14a and the patterns of the drain region 17 and the source region 18 are defined by the pattern of the mask 16a, the gate length Lg of the FET can be obtained from the width of the doped film 14a, and the source-drain distance $D_{ds}$ can be obtained by the width of the mask 16a. Also, the gap between the drain region 18 and the gate region 19 and the gap between the source region 17 and the gate region 19 are defined by the widths of the left and right eaves of the T-shaped construction, and these widths can be well controlled by the conditions of the side-etching. Since no registration defines a relation with the gate length Lg, source-drain distance or source/drain-gate gap, the present invention enables miniaturization of the device without problems of improvement of mask registration.

A preferred embodiment of a method of making is explained by referring to FIGS. 3(a) to 3(g) and FIG. 4. The method comprises Step (A) to Step (G).

Step (A): A p-type high resistivity silicon layer 12 and then an n-type layer 13 are successively epitaxially grown on a p+-type low resistivity silicon substrate 11—FIG. 3(a). Resistivities of the p+-type, p-type and n-type layers 11, 12 and 13 are selected to be, for example, 0.01 Ω·cm, 1-2 Ω·cm and 0.3-0.5 Ω·cm, respectively. Their thicknesses are, e.g. 280 μm, 10–15 μm and 1.4–1.7 μm, respectively. The n-type epitaxial layer 13 becomes an active layer, i.e. channel region of a J-FET at the completion thereof. The p+-type substrate 11 and the p-type layer 12 are used to obtain an electrical contact with a gate region of the J-FET.

Step (B): A selective diffusion of boron is made by a conventional planar technique on the n-type epitaxial layer 13 to obtain an isolation region 20 of p+-conductivity type which defines and electrically isolates an n-type island region 13a. The surface of the n-type epitaxial layer 13 is covered with a silicon dioxide film 21 during the boron diffusion step. The J-FET is to be formed inside the n-type island region 13a.

Step (C): After etching away the silicon dioxide film 21 from the surface, a boron-doped oxide film 14 ($B_2O_3$:$SiO_2$=0.05:0.95) of 5,000 Å in thickness, a polycrystalline silicon film 15 of 4,000 Å and a silicon nitride ($Si_3N_4$) film 16 of 1,000 Å are continuously formed by chemical vapor deposition methods. The total thickness of these three layers can be controlled to be thin, for example, amounting to 1 μm in this embodiment—FIG. 3(c).

Step (D): After a photoresist film pattern (not shown in the drawing) is formed to have openings therein, the silicon nitride film 16 and the polycrystalline silicon film 15 are selectively etched by use of a $CF_4$ plasma gas and the photoresist film pattern as an etching mask pattern, thereby obtaining silicon nitride film patterns 16a and 16b and polycrystalline silicon film patterns 15a and 15b—FIG. 3(d).

Step (E): After removing the photoresist film pattern, the boron-doped oxide film 14 is etched by an etchant consisting of 1 part of HF and 5 parts of $NH_4F$, and by using the silicon nitride film patterns 16a and 16b and the polycrystalline silicon film patterns 15a and 15b as etching masks. This etching is continued even after the surface of the n-type island region 13a is exposed, and thus the boron-doped oxide film 14 is undercut below the polycrystalline silicon film patterns 15a and 15b to result in side-etched boron-doped oxide film patterns 14a and 14b. The three film patterns 14a, 15a and 16a end up in the shape of a mushroom (T-shape) section. In the plan view construction (not shown in the drawing), the boron-doped oxide film patterns 14a and 14b are connected with each other—FIG. 3(e).

When the photoresist film pattern for making the mask over the gate region is 3 μm in width, the silicon nitride film pattern 16a and the polycrystalline silicon film pattern 15a are also 3 μm in width. In this case, the boron-doped oxide film pattern 14a has 1 μm in width as a result of side-etching of 1 μm from both sides. The width of the boron-doped oxide film pattern 14a can be precisely controlled, since it is possible to accurately control the side-etching of the boron-doped oxide film pattern 14a and the width of two film patterns 16a and 15a of the etching masks. As a result of steps from Step (A) to Step (E), the pattern 14a of 1 μm width boron-doped oxide film as a pattern for forming a gate region is obtained by a self-alignment together with openings 31 and 32 at the film patterns 16a and 15a for forming a source region and a drain region.

Step (F): Arsenic ions of $2 \times 10^{15}$ ions/cm$^2$ are implanted into the n-type island region 13a at an ion implantation energy of 100 KeV by use of the mushroom pattern 16a, 15a as a mask. The ion implantation is made precisely of the negative pattern to the silicon nitride film pattern 16a. Then, a heat treatment lasting about 30 minutes to drive the ion-implanted n+-type impurities is made at, e.g. 1,050° C. in a wet $O_2$ gas to form an n+-type source and drain regions 17 and 18. At the same time, the boron atoms contained in the boron-doped oxide film pattern 14a are diffused into the n-type island region 13a, and a p+-type region 19 is formed precisely under the oxide film pattern 14a. Further, an oxide film 22 (not shown in FIG. 3(f), but in FIG. 3(g)) is simultaneously formed on the surface of the wafer during the heat treatment—FIG. 3(f).

Figure 3A:
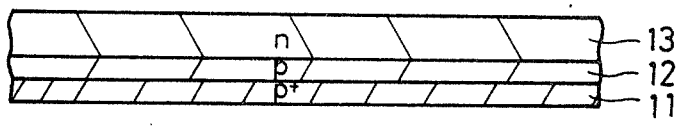
FIGS. 3(a) to FIG. 3(g) are sectional elevation views of one unit of J-FET on an IC, illustrating steps of the manufacturing process embodying the present invention.
Figure 3B:
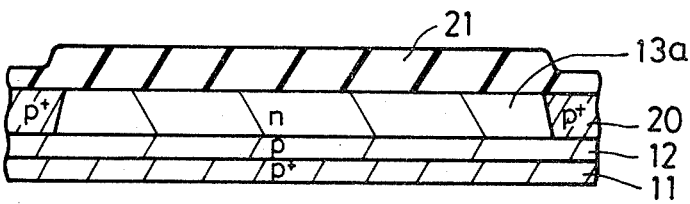
Figure 3C:
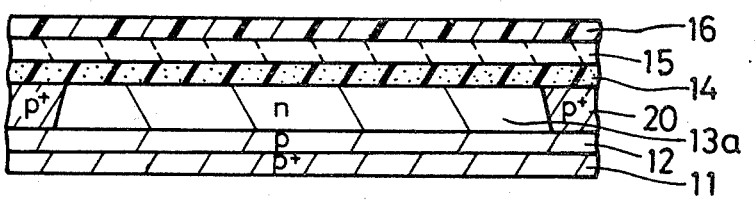
Figure 3D:
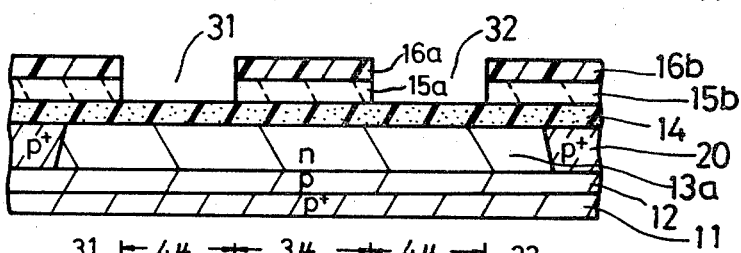
Figure 3E:
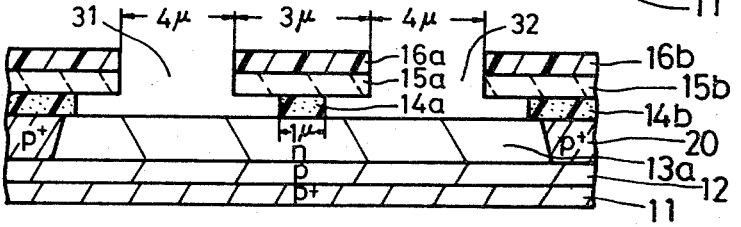
Figure 3F:
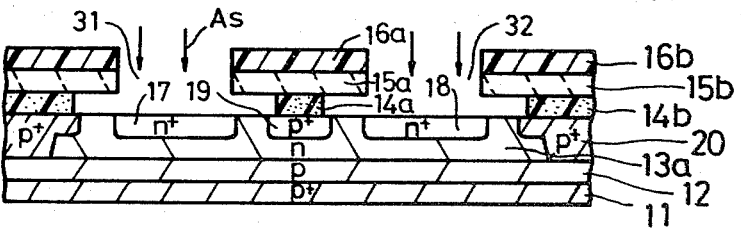

Although not shown in FIG. 3(e) or FIG. 3(f), the boron-doped oxide film patterns 14a and 14b are actually connected in its planview-construction with each other. Therefore, the p+-type gas region 19 is electrically connected with the p+-type diffused isolation region 20. This means that the p+-type gate region 19 is electrically in contact with the p+-type substrate 11, to which a gate potential is applied.

Step (G): The silicon nitride film patterns 16a and 16b and the polycrystalline silicon film patterns 15a and 15b are etched away by $CF_4$ plasma gas. The oxide film 22 is etched to obtain contact openings on the source and drain regions 17 and 18, and aluminum is vacuum-evaporated with 2 μm in thickness to form electrode bumps 23 and 24 for the source and drain regions 17 and 18, respectively. And finally, a gate electrode (not shown) is formed so as to electrically contact the p+-type substrate 11. This completes the method of forming the J-FET in accordance with the present invention—FIG. 3(g).

Since the method embodying the present invention can provide the gate region 19 with a gate length Lg of extremely short, about 1 μm in this embodiment, the gate electrode is not formed on the gate region 19. On the contrary, the gate region 19 is electrically connected through the diffused isolation region 20 with the silicon layer 12 and the substrate 11, on which the gate electrode is formed.

Figure 3G:
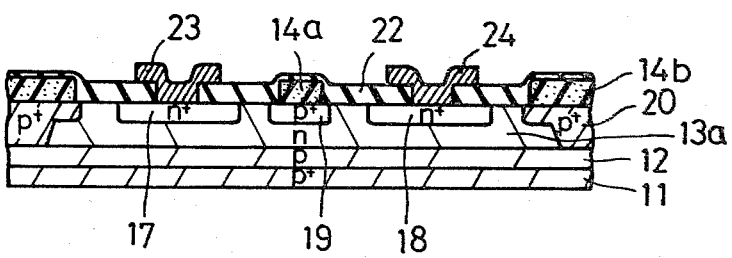

As clearly shown in FIG. 3(g), the completed structure has almost a flat surface, on which the source and drain electrode bumps are easy to form. The completed J-FET has a structure quite different from the above-mentioned conventional GaAs J-FET.

Figure 1:
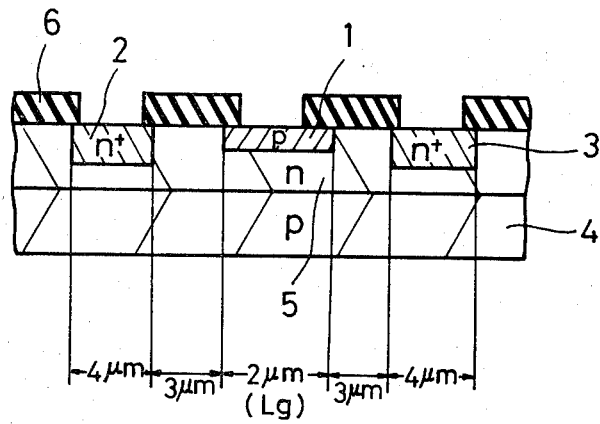
FIG. 1 is a sectional elevation view of a conventional J-FET.

In accordance with the present invention, it is possible to obtain an extremely short gate length Lg of 1.0 μm and further to remarkably decrease the distance between the source and drain regions to 3 μm. These merits are reflected in the operational quality of the finished J-FET, as compared with the conventional J-FET of FIG. 1. Suppose the input capacitances $C_{iss}$ of the J-FET devices are equal to each other, then a mutual conductance $g_m$ of the J-FET in FIG. 3(g) is about 1.5 times as high as that of the conventional J-FET. In other words, suppose the mutual conductances $g_m$ are in the same order, then an input capacitance $C_{iss}$ of the J-FET of the present invention is improved by about 30% with respect to the conventional J-FET of FIG. 1. Therefore, it is possible to largely improve a figure of merit $\sqrt{g_m/C_{iss}}$ in the J-FET prepared by the method of the present invention. Accordingly, the present invention provides the J-FET suitable for application fields where it must be superior in high frequency characteristics and low noise characteristics.

Figure 4:
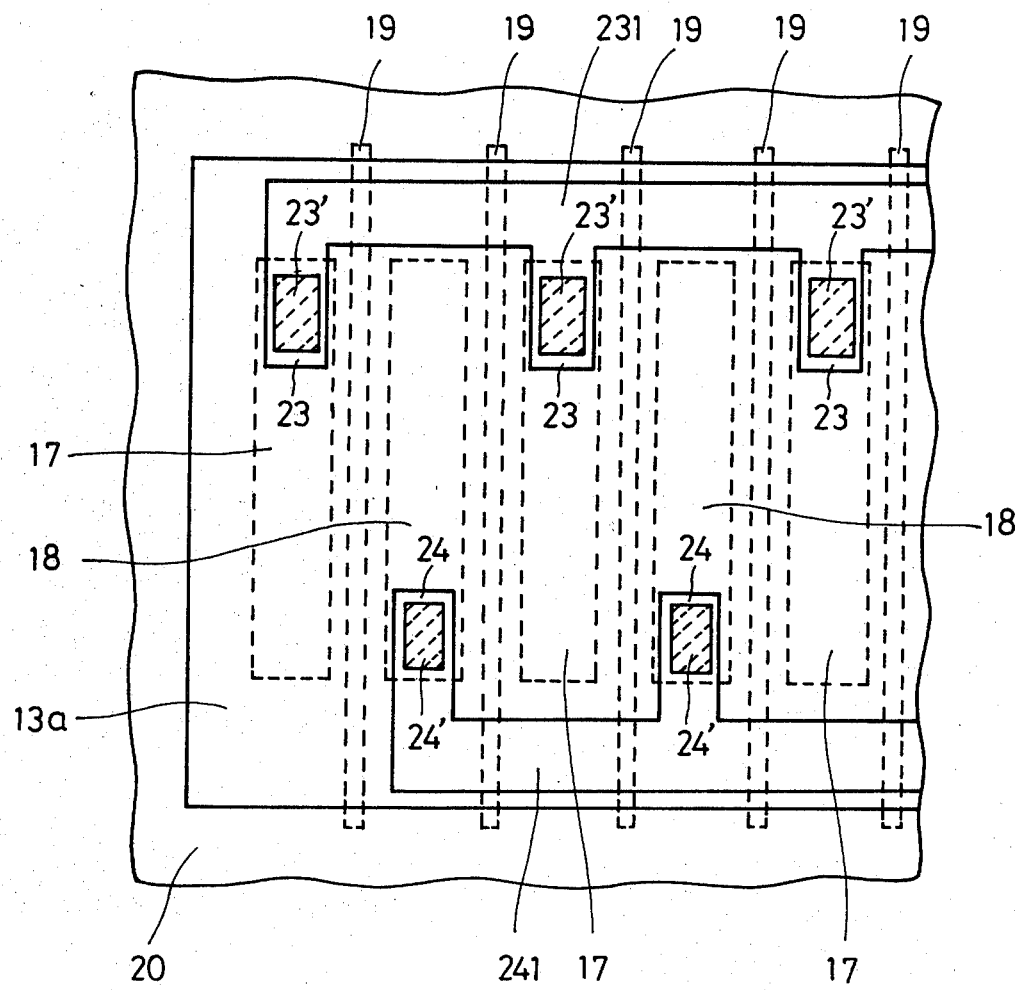
FIG. 4 is a plan view of a part of an IC comprising several elements of the device shown by FIG. 3(g).

In practical use, a J-FET has a planview-structure as shown in FIG. 4, which is a plan view showing a J-FET in practical use made by a method embodying the present invention. In the actual structure of FIG. 4, a number of gate regions 19 are formed parallel to each other in an island region 13a, in order to obtain a large gate width in total. Source regions 17 and drain regions 18 are alternatively formed between the gate regions 19. The gate width of each gate region of a single rectangular shape region 19 corresponds to the length of a long side of the gate region 19. It is, for example, 120 μm. And the total gate width is preferably more than 3,000 μm. That is, about 20–30 of the gate regions 19 are formed in the island region 13a. The source and drain regions 17 and 18 are alternatively disposed between the gate regions 19.

Conductive layers 231 and 241 are formed to connect source regions 17 with each other, and drain regions 18 with each other, respectively. Since the distance between the source and drain regions is 3 μm in the J-FET produced by the method embodying the present invention, remarkably short as compared to the conventional J-FET, it is liable to occur that the source and drain electrodes are short-circuited when the gate electrodes are provided between them. Therefore, the gate electrodes are formed not on the front (top) face, but on the rear (bottom) face side. In addition, the source electrode 23 and the drain electrode 24 are disposed not over the entire areas of the source region 17 or the drain region 18 like a combined comb teeth, but those electrodes 23 and 24 are disposed only in a shape of short branches over side portions of the source and drain regions 17 and 18, respectively, so as to connect the respective region 17 or 18 with the conductive layer 231 or 241.

One example of the arrangement of the electrodes 23 and 24 to avoid the short-circuiting is shown in FIG. 4. Each pair of the electrodes 23 and 24 is disposed such short so as not to be in parallel lines each other, and the gate electrode is not formed on the top face to avoid congestion thereon. Contact places 23' and 24' of the electrodes 23 and 24 with the source and drain regions 17 and 18, respectively, are indicated by dotted hatching in FIG. 4.

As described above, the method of forming the J-FET in accordance with the present invention employs the self-alignment procedure to form the source, drain and gate regions only with a single mask. A fine pattern around the gate area is accurately controllable in forming it by use of the side etching. It is also possible to form the gate region accurately in a silicon layer, thereby producing a J-FET with a short gate length and a short source-drain distance.

The method embodying the present invention has further distinctive features that the formation of the photoresist film pattern is made only once, and that the gate region is electrically connected to the semiconductor substrate. It is no more necessary to form a gate electrode on the top face, and thus it is possible to obtain a fine gate pattern with simplified production steps. Accordingly, the yield of the production of the J-FET is also improved.

In the structure of FIG. 3(a)—FIG. 3(g), the p+-type silicon substrate 11 and the p-type silicon layer 12 serve as a gate contact area on the substrate side. Since a depletion layer is spread deeper into the p-type layer 12 of a low impurity density than into the p+-type substrate 11 of a high impurity density, a gate capacitance can be set to be a smaller value, as compared to a case when a gate contact area is made of only the p+-type substrate 11. *It is naturally possible to employ other structure than that of FIG. 3(a)–FIG. 3(g).* For example, the gate contact area may be made of the p+-type substrate 11 alone, or alternatively, an insulative substrate material can be employed instead of a double composite layers of the p+-type substrate 11 and the p-type layer 12. In the latter case, it is necessary to form gate electrodes on the top face of the device through an opening made on the oxide layer 14a.

The polycrystalline silicon layer 15 is disposed under the silicon nitride film 16 in order to prevent the impurities from diffusing from the doped oxide film patterns 14a and 14b upwards through the silicon nitride film 16 at the step of FIG. 3(f), since it is difficult to obtain a silicon nitride film of a thickness enough to serve this purpose. Accordingly, the polycrystalline silicon layer 15 is not always necessary, when the silicon nitride film 16 is thick. It is further possible to form a channel region, i.e. active layer of n-type in the p-type layer 12 by an ion implantation of As or P ions, instead of using the n-type epitaxial layer 13 where the channel region is formed in the steps of FIG. 3(a) to FIG. 3(g). Furthermore, it is alternatively possible to obtain a J-FET of a p-channel by forming all layers of opposite conductivity types to those used in the structure shown in FIG. 3(a)–FIG. 3(g). In this case, a channel region is p-type, and a silicon dioxide film containing n-type impurity atoms such as P or As is used instead of the boron-doped oxide film 14, and boron ions are used in an ion implantation thereby obtaining an n-type gate region, and a p-type source and drain regions.

TABLE 1

|  | Example 1 | Example 2 |
|---|---|---|
| gate length Lg ($\mu$m) | 1.0 | 1.0 |
| source-drain distance ($\mu$m) | 3 | 3 |
| pitch of unit J-FET ($\mu$m) | 7 | 7 |
| width of unit J-FET ($\mu$m) | 3,120 | 4,560 |
| area of a well ($\mu$m$^2$) | 27,720 | 39,480 |
| $g_{mo}$ (mS) | 33 | 48 |
| $g_m$ (mS) | 22 | 32 |
| $C_{iss}$ (pF) | 4.4 | 6.5 |
| FM = $\sqrt{g_m}/C_{iss}$ | 1.0 | 0.9 |

Table 1 is a comparison table showing several parameters of two J-FETs to compare figures of merit produced by the method embodying the present invention with each other. The device of Example 1 is designed so as to have a small $C_{iss}$ and the device of Example 2 is designed so as to have a large $g_{mo}$.

In conclusion, the present invention can provide a J-FET with a short gate length, short source-drain distance and short drain/source-gate distance by utilizing the side etched doped oxide film under the etching mask and the ion implantation step, or can provide an IC device containing a number of J-FETS with ease, and besides a high yield in the production steps.

What is claimed is:

1. A method of making a field effect transistor comprising the steps of:
    (a) forming a semiconductor layer of a first conductivity type to become a channel region on a semiconductor substrate of a second conductivity type opposite to said first conductivity type,
    (b) forming selectively an isolation region of said second conductivity type in said semiconductor layer in a manner that the selectively formed isolation region penetrates into said semiconductor layer, reaching the surface of said semiconductor substrate and forming an isolated island region of said first conductivity type in said semiconductor layer,
    (c) forming successively a doped oxide film, a poly-crystalline silicon film and a silicon nitride film on the surfaces of said isolated island region and said isolation region, said doped oxide film containing an impurity to result in said second conductivity type,
    (d) removing selectively said poly-crystalline silicon film and said silicon nitride film thereby retaining a predetermined pattern of a mask to be used as an etching mask for subsequent etching of said doped oxide film, the retained pattern having a length extending to a part above said isolation region,
    (e) etching and side-etching said doped oxide film by use of the retained pattern as said etching mask thereby exposing the surface of said isolated island region at parts which are not covered by said etching mask and which surround said etching mask so that said doped oxide film becomes narrower than a width of said etching mask and has a length extending to reach above said isolation region,
    (f) ion-implanting another impurity of said first conductivity type into said isolated island region by use of said etching mask as an implantation mask,
    (g) carrying out a heat treatment to diffuse said second conductivity type impurity from said doped oxide film retained narrowed by said side-etching under said etching mask into a region to become said channel region in said isolated island region thereby to form a gate region, and also to drive said ion-implanted another impurity into said isolated island region thereby to respectively form a source region and a drain region on both sides of said etching mask,
    (h) removing said etching mask followed by forming an oxide layer over the entire surface of said semiconductor layer,
    (i) forming a source and a drain electrode at least at openings partly formed above said source and said drain regions, respectively, in such a manner that the openings for said source and said drain regions are formed on both sides of said gate region apart from each other with a distance larger than the shortest distance between said source and said drain regions with said gate region disposed therebetween.

2. A method of making a field effect transistor in accordance with claim 1, further comprising the step of forming a gate electrode at said semiconductor substrate so that said gate electrode and said gate region are ohmically connected with each other by means of said isolation region.

3. A method of making a field effect transistor in accordance with claim 1 or 2, wherein said semiconductor layer is of a silicon crystalline layer.

4. A method of making a field effect transistor in accordance with claim 1 or 2, wherein said semiconductor substrate is of silicon.

5. A method of making a field effect transistor comprising the steps of:
    (a) forming a semiconductor layer of a first conductivity type to become a channel region in a semiconductor substrate of a second conductivity type opposite to said first conductivity type,
    (b) forming selectively an isolation region of said second conductivity type in said semiconductor layer in a manner that the selectively formed isolation region penetrates into said semiconductor layer, reaching the surface of said semiconductor substrate and forming an isolated island region of said first conductivity type in said semiconductor layer,
    (c) forming successively a doped oxide film, a poly-crystalline silicon film and a silicon nitride film on the surfaces of said isolated island region and said isolation region, said doped oxide film containing an impurity to result in said second conductivity type,
    (d) removing selectively said poly-crystalline silicon film and said silicon nitride film thereby retaining a predetermined pattern of a mask to be used as an etching mask for subsequent etching of said doped oxide film, the retained pattern having a length extending to a part above said isolation region,
    (e) etching and side-etching said doped oxide film by use of the retained pattern as said etching mask thereby exposing the surface of said isolated island region at parts which are not covered by said etching mask and which surround said etching mask so that said doped oxide film becomes narrower than a width of said etching mask and has a length extending to reach above said isolation region,
    (f) ion-implanting another impurity of said first conductivity type into said isolated island region by use of said etching mask as an implantation mask, (g) carrying out a heat treatment to diffuse said second conductivity type impurity from said doped oxide film retained narrowed by said side-etching under said etching mask into a region to become said channel region in said isolated island region thereby to form a gate region, and also to drive said ion-implanted another impurity into said isolated island region thereby to respectively form a source region and a drain region on both sides of said etching mask, (h) removing said etching mask followed by forming an oxide layer over the entire surface of said semiconductor layer, (i) forming a source and a drain electrode at least at openings partly formed above said source and said drain regions, respectively, in such a manner that the openings for said source and said drain regions are formed on both sides of said gate region apart from each other with a distance larger than the shortest distance between said source and said drain regions with said gate region disposed therebetween.

6. A method of making a field effect transistor in accordance with claim 5, further comprising the step of forming a gate electrode at said semiconductor substrate so that said gate electrode and said gate region are ohmically connected with each other by means of said isolation region.

* * * * *